(12) United States Patent
Takahashi

(10) Patent No.: US 7,330,495 B2
(45) Date of Patent: Feb. 12, 2008

(54) VERTICAL CAVITY SURFACE EMITTING LASER DIODE HAVING A HIGH REFLECTIVE DISTRIBUTED BRAGG REFLECTOR

(75) Inventor: Mitsuo Takahashi, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 285 days.

(21) Appl. No.: 11/089,129

(22) Filed: Mar. 24, 2005

(65) Prior Publication Data

US 2005/0213629 A1 Sep. 29, 2005

(30) Foreign Application Priority Data

Mar. 26, 2004 (JP) ............... 2004-093299

(51) Int. Cl.
*H01S 3/08* (2006.01)
(52) U.S. Cl. ............... 372/99; 372/46.013; 372/50.11; 372/50.124; 438/22; 438/29
(58) Field of Classification Search ........... 372/46.013, 372/50.11, 50.124, 99
See application file for complete search history.

(56) References Cited

U.S. PATENT DOCUMENTS

| | | | | |
|---|---|---|---|---|
| 5,577,064 A | * | 11/1996 | Swirhun et al. | 372/96 |
| 6,014,400 A | * | 1/2000 | Kobayashi | 372/96 |
| 6,026,108 A | * | 2/2000 | Lim et al. | 372/50.11 |
| 6,185,241 B1 | * | 2/2001 | Sun | 372/96 |
| 6,700,914 B2 | * | 3/2004 | Yokouchi et al. | 372/50.11 |
| 6,717,972 B2 | * | 4/2004 | Steinle et al. | 372/50.21 |
| 6,865,214 B2 | * | 3/2005 | Kim | 372/96 |
| 2003/0021322 A1 | * | 1/2003 | Steinle et al. | 372/50 |
| 2004/0028092 A1 | * | 2/2004 | Kim | 372/20 |
| 2004/0218655 A1 | * | 11/2004 | Tandon et al. | 372/96 |
| 2004/0264530 A1 | * | 12/2004 | Ryou et al. | 372/44 |

FOREIGN PATENT DOCUMENTS

JP 10-125999 5/1998

* cited by examiner

*Primary Examiner*—Minsun Oh Harvey
*Assistant Examiner*—Yuanda Zhang
(74) *Attorney, Agent, or Firm*—Smith, Gambrell & Russell, LLP

(57) ABSTRACT

The present invention is to provide a vertical cavity surface emitting laser diode (VCSEL) that has a functional distributed Bragg reflector (DBR) comprised of less number of pairs of reflective layers. The VCSEL of the invention include a lower DBR, an upper DBR and an active layer arranged between the upper and lower DBRs. The upper DBR is comprised of a plurality of pairs including GaAs layers and aluminum oxide layers, thus the GaAs layers and the aluminum oxide layers are alternately stacked to each other. Since the refractive index of the aluminum oxide ($Al_2O_3$) is 1.67 at 1.3 μm and that of the GaAs is 3.51, the difference of these refractive index becomes 1.85, which is far greater than the combination of the AlAs and the GaAs, thereby decreasing the number of pairs for the DBR.

14 Claims, 10 Drawing Sheets

VERTICAL CAVITY SURFACE EMITTING LASER DIODE HAVING A HIGH REFLECTIVE DISTRIBUTED BRAGG REFLECTOR

BACKGROUND OF THE INVENTION

1. Field of the Invention

The present invention relates to a vertical cavity surface emitting laser diode (hereinafter denoted as VCSEL), in particular, relates to a structure of a mirror defining a cavity of the VCSEL.

2. Related Prior Art

The VCSEL enables to emit light with nearly circular field pattern because the VCSEL emits light from the primary surface of the semiconductor layer, not from an end surface thereof. Moreover, the VCSEL in particular the active portion thereof, may be integrated on single substrate with high density.

The VCSEL provides a lower mirror and an upper mirror on a GaAs substrate, between which an active layer is sandwiched. In one of prior VCSELs, these lower and upper mirrors have a structure of alternately stacked AlAs layer and GaAs layer. These mirrors operate and are called as a distributed Bragg reflector (DBR).

These upper and lower DBRs should have relatively high reflectivity to emit coherent light for the VCSEL. Following two methods are well known to increase the reflectivity: (1) to increase the layers constituting the DBR and (2) to increase the difference of the refractive index of each layer constituting the DBR. However, when semiconductor materials are used to form these two layers in the DBR, taking the lattice constant of two layers adjacent to each other into account, applicable materials are quite restricted. That is, although the substantial difference of the refractive index may be obtained from the single crystal, to grow the semiconductor single crystal in alternate must be necessary to coincide with their lattice constants to each other. Therefore, it is considerably hard to take the latter method to increase the reflectivity. Accordingly, the former method, namely to increase the number of layers, has been an available solution, which increases the size of the VCSEL and complicates the process thereof.

Therefore, one object of the present invention is to provide a vertical cavity surface emitting laser diode having a reflectivity enough to emit coherent light with a reduced number of layers for the upper or the lower DBRs.

SUMMARY OF THE INVENTION

According to one aspect of the present invention, a vertical cavity surface emitting laser diode (VCSEL) is to be provided. The VCSEL of the present invention comprises a semiconductor substrate, a first distributed Bragg reflector (DBR), a second DBR, and an active layer sandwiched by first and second DBRs. In the present invention, the second DBR includes a plurality of pairs comprised of a first semiconductor layer and an aluminum oxide layer. These first semiconductor layers and aluminum layers are alternately stacked to each other.

The first semiconductor layer may be a GaAs layer, and the aluminum oxide layer may be formed by the oxidization of at least one of AlAs layer and AlGaAs layer. These aluminum containing semiconductor materials have lattice constants substantially matching to that of GaAs, and a difference in the refractive index of the oxide form, i.e., the aluminum oxide, with that of GaAs becomes far greater than those of not oxidized form. Therefore, when such aluminum oxide layer converted from the semiconductor material is used in the DBR, the number of pairs of the first semiconductor layer and the aluminum oxide layer can be reduced. In the present invention, the number of pairs may be reduced at least five (5).

The DBR of the present invention may further include a plurality of second semiconductor layers in a peripheral region of the aluminum oxide layer. The first semiconductor layer may be divided into the center region and the peripheral region. The aluminum oxide layer may be provided on the center region, while the second semiconductor layer may be provided on the peripheral region. Since the adhesion between semiconductor materials is stronger than that between the semiconductor material and the aluminum oxide material, this configuration effectively prevent the aluminum oxide layer from peeling off the first semiconductor layer.

The present VCSEL may further include a third DBR between the second DBR and the active layer. This third DBR comprises a plurality of pairs comprises of a third and a fourth semiconductor layer, both of which may be substantially lattice matched to said substrate and also lattice miss-matched to said first semiconductor layer. The second DBR may mechanically attached to the third DBR. Accordingly, even the semiconductor material constituting the second DBR has lattice constant mismatched to the semiconductor substrate, the DBR with enough reflectivity may be obtained.

According to another aspect of the invention, a method for manufacturing the VCSEL is to be provided. The method comprises steps of:

(a) growing semiconductor layers on a semiconductor substrate in successive for a first DBR, an active layer and a second DBR. The layers for the first DBR include a plurality of pairs comprised of a first and second semiconductor films, both lattice matching to the substrate, and the layers for the second DBR include a plurality of pairs comprised of a third and fourth semiconductor films. The fourth semiconductor film is made of material composed of aluminum.

(b) forming a mesa for the second DBR.

(c) oxidizing the aluminum composed of the fourth semiconductor film to convert the fourth semiconductor film into the aluminum oxide layer.

According to still another aspect of the invention, a method for manufacturing the VCSEL is to be provided. The method comprises steps of:

(a) growing semiconductor layers for a first DBR, an active layer and a second DBR. The layers for the first DBR include a plurality of pairs comprised of a first and second semiconductor films, and the layers for the second DBR include a plurality of pairs comprised of a third and fourth semiconductor films.

(b) growing semiconductor layers for a third DBR. This growth process is independently carried out of the step (a). The layers include a plurality of pairs comprised of fifth and sixth semiconductor films. The fifth semiconductor film is made of material composed of aluminum (Al).

(b) forming a mesa for the second DBR.

(c) oxidizing the aluminum contained in the fifth semiconductor film to convert the fifth semiconductor film into the aluminum oxide layer.

(d) attaching the third DBR to the second DBR in hydrogen atmosphere.

In the present method, the first growth (a) is carried out on a first semiconductor substrate that has a first lattice constant. The second growth (b), independently carried out of the first growth (a), may be carrier out on a second semiconductor substrate that has a lattice constant different from the first lattice constant. Thus formed second and third DBRs may be attached to each other in step (d) in hydrogen atmosphere at temperatures around 600 degree Celsius. Before attaching in step (d), the second semiconductor substrate may be removed from the third DBR.

DESCRIPTION OF PREFERRED EMBODIMENTS

Figure 1:
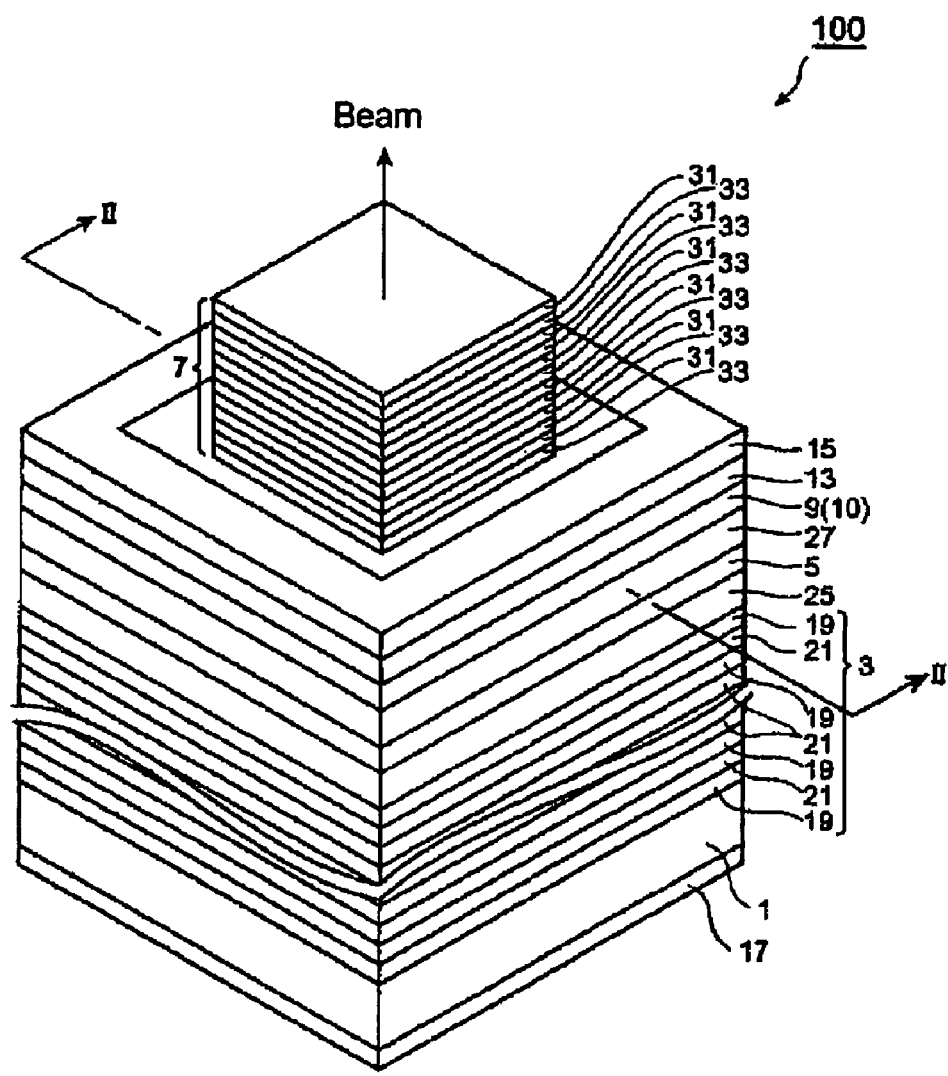
FIG. 1 is a schematic view showing a VCSEL according to a first embodiment of the present invention.

Next, preferred embodiments of the present invention will be described as referring to accompanying drawings. In the drawings and their explanations, same elements, if possible, will be referred by the same numerals or symbols without overlapping description.

First Embodiment

Figure 2:
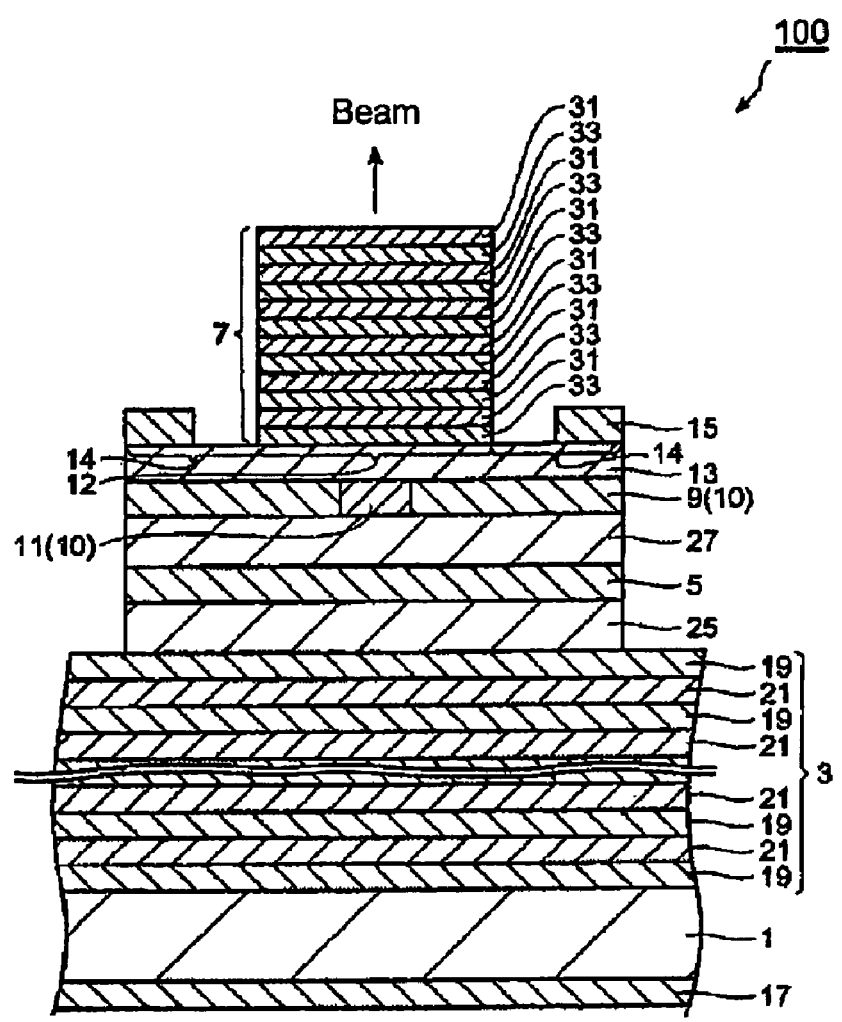
FIG. 2 is a cross section taken along the line II-II shown in FIG. 1.

FIG. 1 is a perspective view schematically showing a vertical cavity surface emitting laser diode (VCSEL) 100 according to the first embodiment of the present invention, and FIG. 2 is a cross section of this VCSEL taken along the line II-II in FIG. 1.

The VCSEL 100 provides a lower distributed Bragg reflector (DBR) 3, an upper DBR 7 and an active layer 5 between the lower and upper DBRs. Between the active layer 5 and the lower DBR 3 is provided with a first AlGaAs layer 25, while between the active layer 7 and the upper DBR 7 is provides with a second AlGaAs layer 27. The first and second AlGaAs layers, accompanied with the active layer 5, form an optical cavity with a thickness of one wavelength λ.

Between the second AlGaAs layer and the upper DBR 7 is preferably provided with a current confinement layer 10. This current confinement layer 10 has a center portion 11 for passing the current and a peripheral portion 9 surrounding the center portion 11. The center portion 11 may be made of the p-type AlGaAs with a thickness of $\lambda/4/n_{r2}$, where λ is the emitting wavelength of this VCSEL and $n_{r2}$ is an effective refractive index of the p-type AlGaAs, and the peripheral portion 11 may be made of oxidized p-type AlGaAs.

Between the current confinement layer 10 and the upper DBR 7 is preferably provided with a p-type GaAs layer 13, a thickness of which is preferably $\lambda/4/n_{r4}$, where $n_{r4}$ is the effective refractive index of the p-type GaAs layer 13. The surface of this p-type GaAs layer 13 has a center region 12 and a peripheral region 14 surrounding the center region 12. On the center region 12 is provided with the upper DBR 7, while on the peripheral region 14 is formed by a p-type electrode 15. The upper DBR 7 is above the center portion 11 of the current confinement layer 10. The n-type electrode 17 is formed on the back surface of the n-type GaAs substrate 1. This VCSEL may emit light by supplying the current between the p-type and n-type electrodes, 15 and 17, respectively.

The active layer 5 may have a quantum well structure (QW), such as multi-quantum well (MQW) or a single-quantum well (SQW). In the present embodiment, the active layer 5 has a quantum well structure made of a combination of GaInNAs and GaAs. However, the combination of materials constituting the quantum well structure is not restricted to that mentioned here. Another combination, such as InGaAs and GaAs, may be considered in ease for an ordinal person skilled in the semiconductor optical device The lower DBR 3 has a structure of alternately stacked n-type AlGaAs 19 doped with Si and n-type GaAs 21 doped with Si. In the present embodiment, twenty-three (23) n-type AlGaAs layers 19 and twenty-two (22) n-type GaAs layers 21 are stacked. Therefore, the uppermost and lowermost layers of the lower DBR 3 become n-type AlGaAs 19.

The thickness of the n-type AlGaAs layer 19 may be $\lambda/4/n_{r1}$ assuming the effective refractive index of the n-type AlGaAs 19 to be $n_{r1}$, while the thickness of the n-type GaAs 21 is preferably to be $\lambda/4/n_{r2}$, where $n_{r2}$ is the effective refractive index of the n-type GaAs 21 and λ is the emitting wavelength of this VCSEL 100.

On the other hand, the upper DBR 7 is comprised of alternately stacked GaAs layer 31 and aluminum oxide layer 33. The uppermost layer of the upper DBR 7 is the Oaks layer 31, while the lowermost layer is the aluminum oxide layer 33. The GaAs layer 31 may be made of un-doped GaAs with the thickness of, assuming the effective refractive index of the GaAs is $n_{r6}$, $\lambda/4/n_{r6}$. While, the thickness of the aluminum oxide layer 33 may be $\lambda/4/n_{r7}$, where $n_{r7}$ is the effective refractive index of aluminum oxide layer and λ is the emitting wavelength of the VCSEL 100. The aluminum oxide layer 33 may be formed by the oxidization of at least AlGaAs and AlAs, or more specifically, the aluminum oxide layer 33 may include $Al_xO_y$. The aluminum oxide layer 33 may include gallium (Ga) atoms.

Next, some numerical estimation is carried out below for the upper DBR 7. The refractive index of AlAs is 2.96 at the wavelength of 1300 nm, while that of GaAs is 3.51. Therefore, difference of refractive indices Δn becomes:

$$\Delta n = |n(AlAs) - n(GaAs)| = 0.55.$$

On the other hand, for the combination of the aluminum oxide layer and the GaAs layer, since the refractive index of the former layer at 1300 nm is 1.67, the difference of the refractive indices becomes:

$$\Delta n = |n(Al_2O_3) - n(GaAs)| = 1.85,$$

which is conspicuously greater than the former case, and thus makes the reflectivity of the upper DBR 7 higher enough to be acceptable in the VCSEL.

Figure 3:
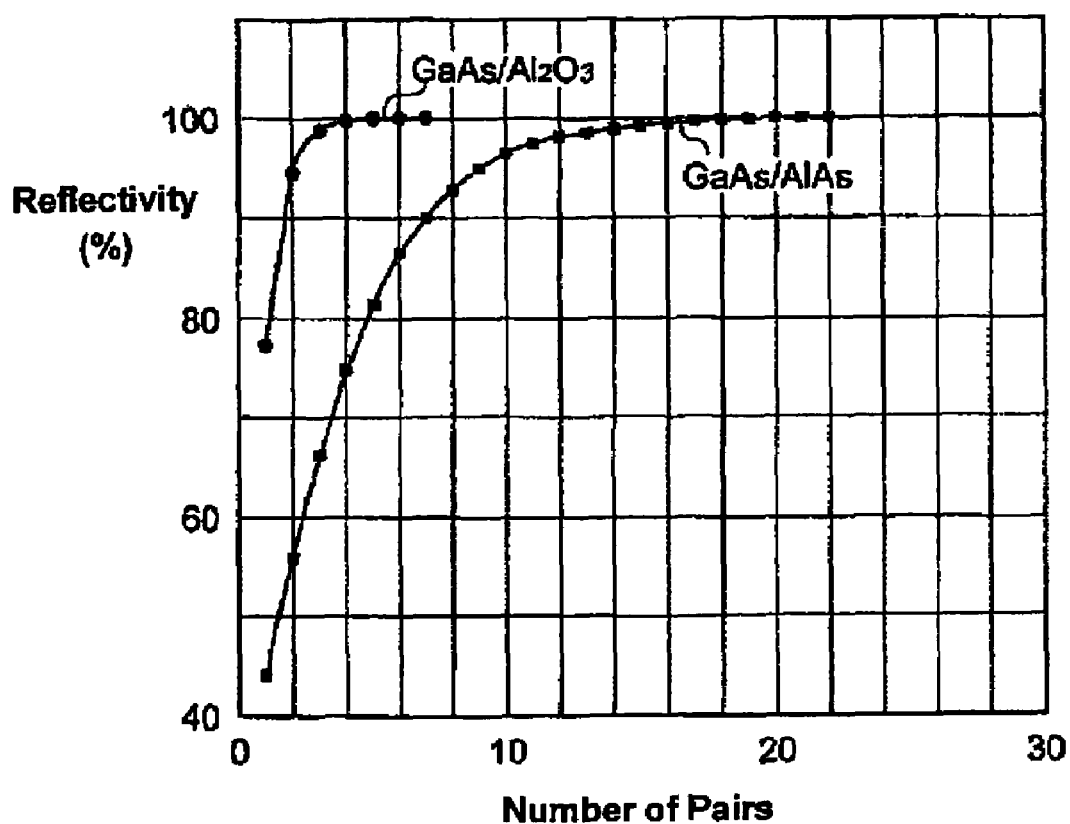
FIG. 3 shows a dependence of the reflectivity on the number of pairs of two layers each constituting the DBR portions.

FIG. 3 shows a relation between the number of paired layers and the reflectivity thereof. In FIG. 3, two combinations, one is GaAs and $Al_2O_3$ and the other is GaAs and AlAs, are shown. As shown in FIG. 3, more than 5 pairs of GaAs and $Al_2O_3$ are preferable for the upper DBR of the VCSEL 100 to obtain the reflectivity greater than 99%. The embodiment shown in FIG. 1 and FIG. 2 provides six pairs of GaAs layer 31 and $Al_2O_3$ layers 33. Thus, the combination of aluminum oxide and GaAs enables to decrease the number of pairs necessary to obtain an enough reflectivity for the VCSEL, which not only minimizes the size of the VCSEL 100 but also simplifies the process for manufacturing the VCSEL 100.

Figure 4:
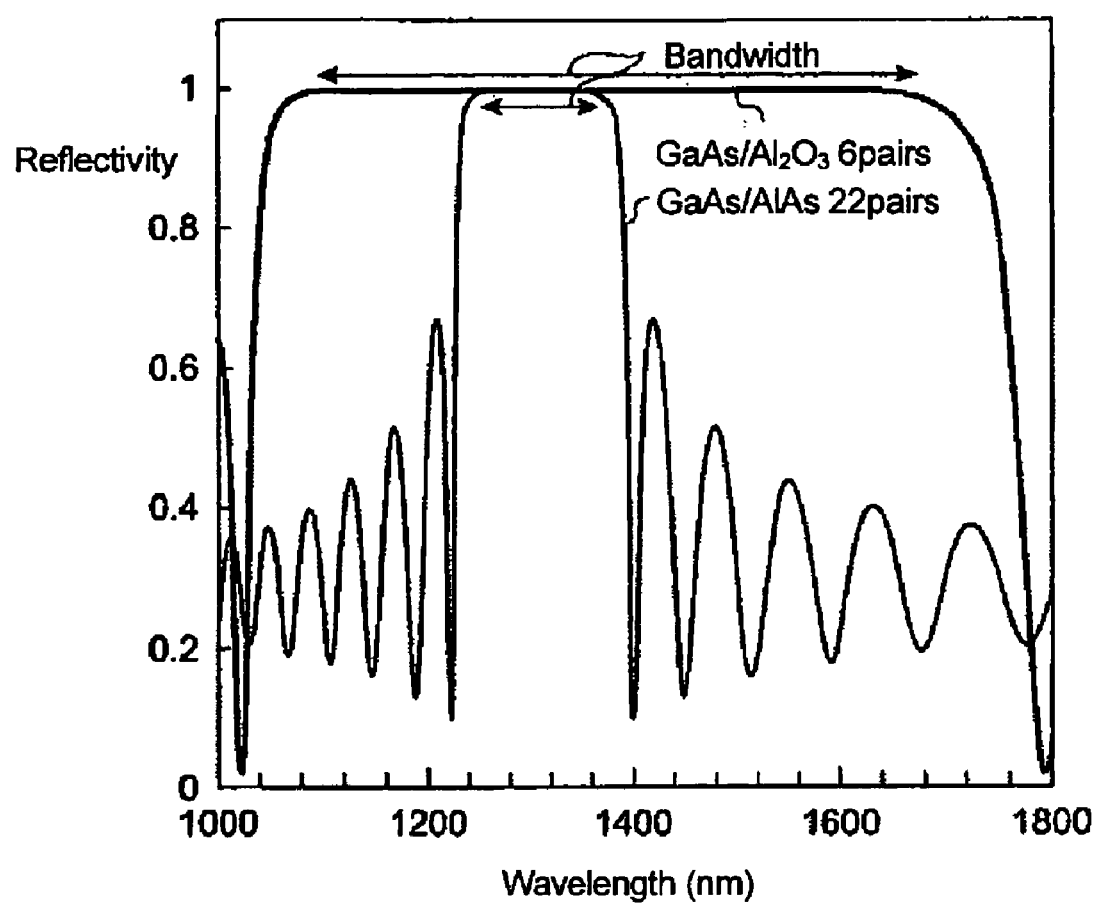
FIG. 4 shows two reflection spectra of the DBR portions each comprised of pairs of two type layers.

FIG. 4 shows a reflection spectra of respective combinations of layers, namely, one is six-pairs of GaAs and $Al_2O_3$ while the other is twenty-two (22) pairs of GaAs and AlAs. As shown in FIG. 4, the combination GaAs and the aluminum oxide shows wider reflection band as compared with the combination of GaAs and AlAs, showing nearly 100% from 1100 nm to 1600 nm, which enables to enhance the flexibility of the manufacturing process and the applicability of the present VCSEL.

Figure 5:
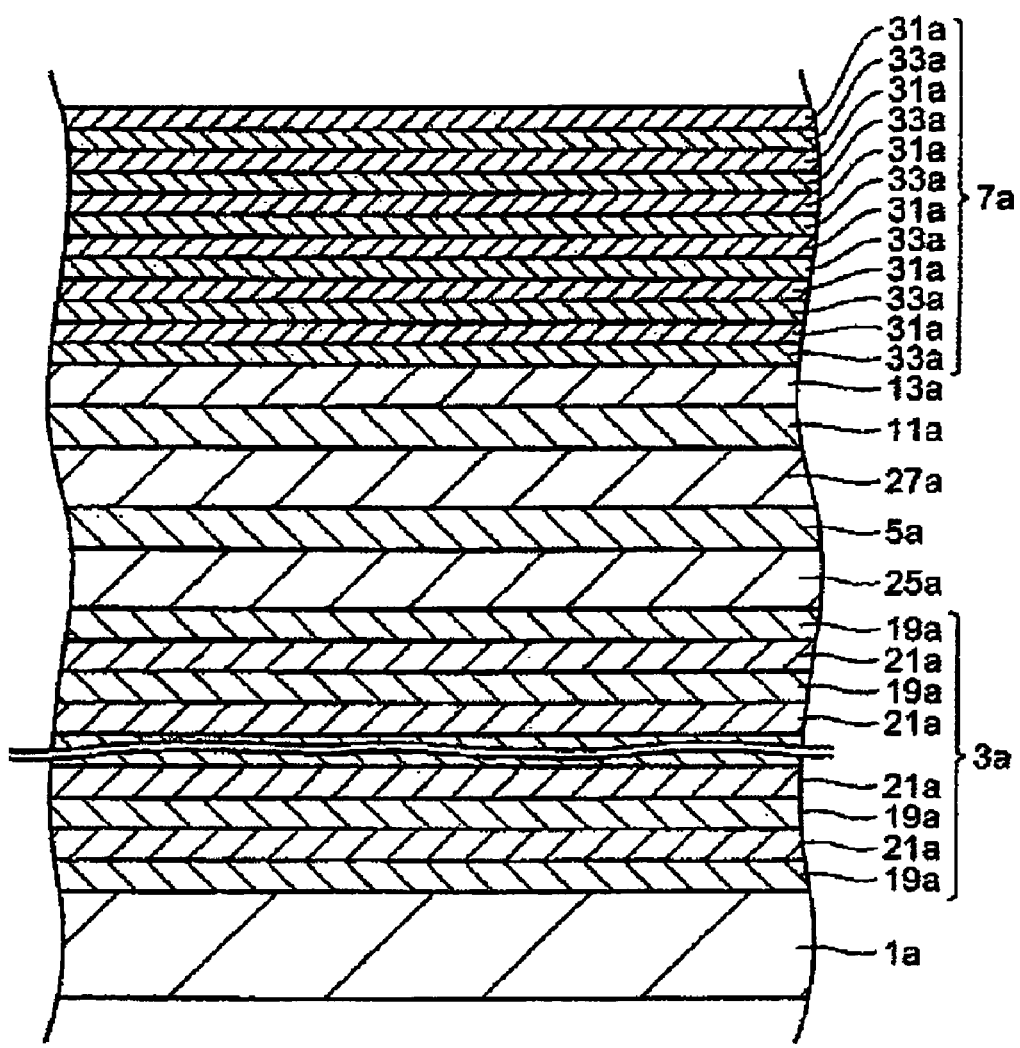
FIG. 5 is a schematic cross section showing a process for manufacturing the VCSEL of the present invention.

Next, the manufacturing process of the present VCSEL will be described as referring to FIG. 2 and from FIG. 5 to FIG. 7, which show cross sections at various production steps.

(Formation of the Lower DRB Films)

Figure 6:
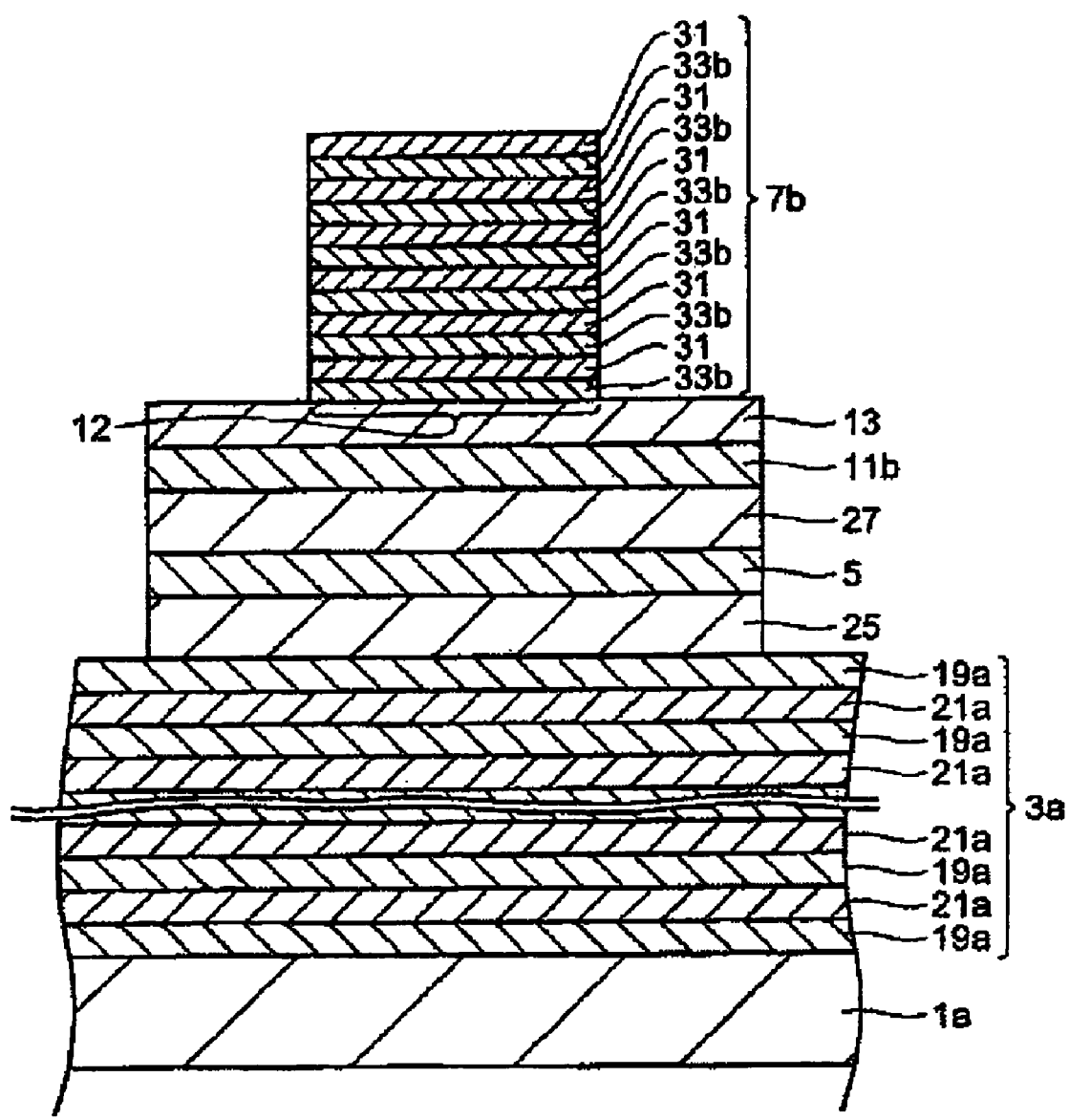
FIG. 6 is a schematic cross section showing another process for manufacturing the VCSEL.

First, as shown in FIG. 6, a plurality of n-type AlGaAs films 19a and a plurality of n-type GaAs films 21a are epitaxially grown in alternate on the n-type GaAs substrate 1a. In the present VCSEL 100, twenty three (23) n-type AlGaAs films 19a and twenty two (22) n-type GaAs films 21a are grown to form the lower DBR 3a.

The thickness of the n-type AlGaAs film 19a is preferably $\lambda/4/n_{r1}$, where $n_{r1}$ is the effective refractive index of the n-type AlGaAs, while that of the n-type GaAs film 21a is preferably $\lambda/4/n_{r2}$, assuming the effective refractive index of the n-type GaAs and the emitting wavelength is $n_{r2}$ and $\lambda$, respectively.

(Formation of the Active Layer Films)

Next, a first AlGaAs film 25a, an active layer film 5a, a second AlGaAs film 27a, a p-type AlGaAs film 11a and a p-type GaAs Mm 13a are epitaxially grown in successive on the lower DBR 3a. The thickness of the p-type AlGaAs film 11a and that of the p-type GaAs are preferably $\lambda/4/n_{r3}$ and $\lambda/4/n_{r4}$, where $n_{r3}$ and $n_{r4}$ are the effective refractive index of the p-type AlGaAs and the p-type GaAs, respectively.

(Formation of the Upper DBR Stack)

Next, a plurality of un-doped GaAs films 31a and a plurality of un-doped AlAs films 33b are alternately grown on the p-type GaAs 13a. In the present embodiment, six (6) GaAs films 31a and six (6) un-doped AlAs films 33b are stacked to form the upper DBR stack 7a, which includes six pairs of GaAs and AlAs.

The thickness of the GaAs film 31a may be $\lambda/4/n_{r6}$ and that of the AlAs film 33b may be $\lambda/4/n_{r5}$, where $n_{r6}$ and $n_{r5}$ are effective refractive indices of the un-doped GaAs and the oxidized AlAs, respectively. The effective refractive index of the AlAs and the thickness thereof are to be changed by the oxidization. Therefore, the thickness of the AlAs film 33b is necessary to be determined by taking these changes of the thickness and the refractive index thereof into account.

(Etching)

Next, as shown in FIG. 6, the upper DBR stack 7b are etched such that a laser post of the upper DBR shapes 10 micron meters square. In illustrative, on the upper DBR stack 7a is provided with an etching mask (not shown in FIG. 6) first, and the upper DBR stack 7a is etched by the reactive ion etching (RIE) technique. Thus, the upper DBR 7b with a mesa shape having 10 micron meters square is formed as the laser post and exposes a portion of the p-type GaAs film 13a. The shape of the upper DBR 7b is not restricted to the rectangle, and a circle with a diameter of about 10 μm may be applicable as the laser post.

Next, another mask, although not shown in FIG. 6, is formed on the p-type GaAs film 13a to cover the upper DBR 7b. Using this mask, the p-type GaAs film 13a, the p-type AlGaAs film 11a, the second AlGaAs film 27a, the active layer film 5a and the first AlGaAs film 25a are sequentially etched by the dry-etching. Thus, this etching process forms the p-type GaAs layer 13, the p-type AlGaAs layer 11b, the second AlGaAs layer 27, the active layer 5 and the first AlGaAs layer 25, and exposes a portion of the lower DBR 3a.

(Oxidization)

Next, the p-type AlGaAs 11b is selectively oxidized to form the current confinement layer 10. The size and the shape of the center portion 11 of the current confinement layer 10 may be about 5 μm square.

Figure 7:
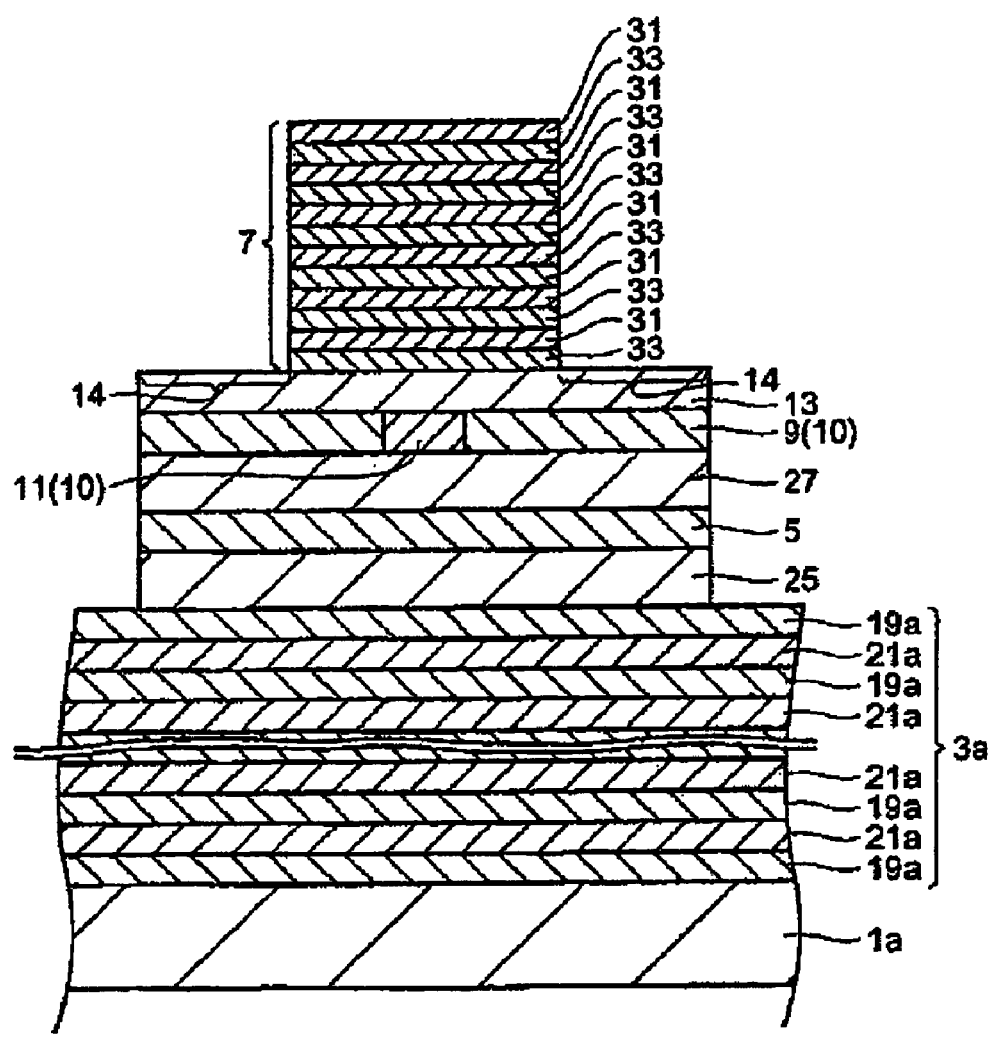
FIG. 7 is a schematic cross section showing still another process for manufacturing the VCSEL.

Oxidizing the whole portion of the AlAs film 33b, an aluminum oxide layer 33 may be obtained as shown in FIG. 7, which converts the upper DBR 7b to the functional upper DBR 7 providing aluminum oxide layers 33 on the center region 12 of the p-type GaAs layer 13. Oxidization is carried out by, for example, thermal oxidization method performed under hydro-thermal atmosphere. In this oxidization, the current confinement layer 10 and the aluminum oxide layers 33 are formed in one process, which simplifies the process and reduced the manufacturing cost.

Since aluminum composition in the AlAs film 33b is greater than that of the p-type AlGaAs film 11b, the oxidizing rate is greater in the AlAS film 33b than that in the p-type AlGaAs film 11b. Therefore, the condition for the whole oxidization of the AlAs film 33b and the selective oxidization of the p-type AlGaAs film 11b in one time process may be obtained by adjusting the aluminum composition in the p-type AlGaAs film 11b. Further, by adjusting the shape and the size of respective films 33b and 11b, the oxidized region may be also controlled.

(Formation of the Electrodes)

Next, on the second region 14 of the p-type GaAs layer 13 is formed with the p-type electrode 15, as shown in FIG. 2. On the other hand, the back surface of the n-type GaAs substrate 1a is formed by the n-type electrode, which completes the VCSEL 100.

Second Embodiment

Figure 8:
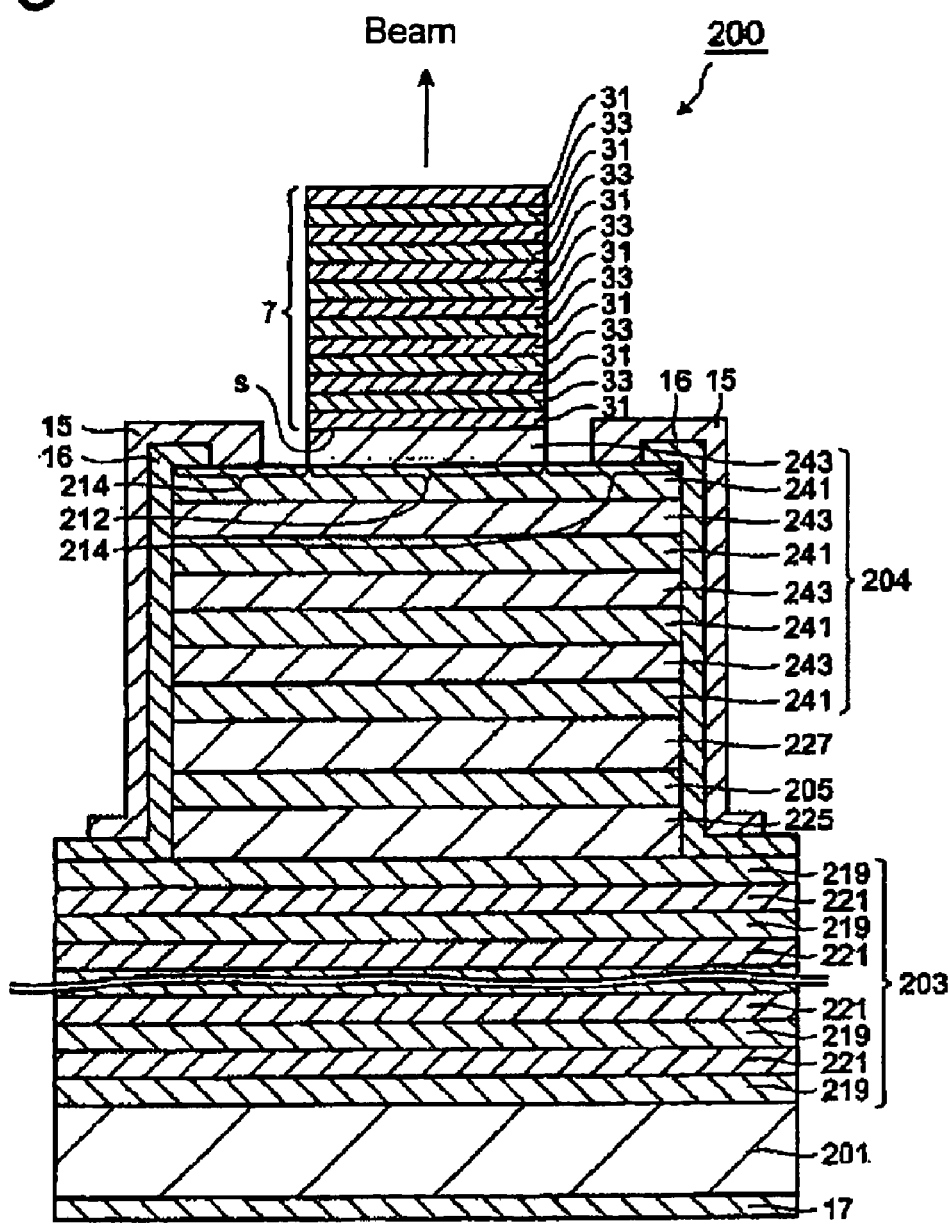
FIG. 8 is a schematic cross section showing the second embodiment of the VCSEL according to the present invention.

FIG. 8 is a cross section showing another VCSEL 200 according to the second embodiment of the invention. The VCSEL 200 of the second embodiment has an n-type InP substrate 201, a lower DBR 203, an upper DBR 7, and an active layer 205 between the lower and upper DBRs, 203 and 7, respectively.

The lower DBR 203 comprises n-type InGaAsP layers 219 doped with Si and n-type InP layers 221 doped with Si alternately stacked to each other. In this embodiment, twenty six (26) n-type InGaAsP layers 219 and twenty five (25)

n-type InP layers 221 are stacked. Therefore, the uppermost and lowermost layers of the lower DBR 203 are the n-type InGaAsP layer 219.

The thickness of the n-type InGaAsP layer 219 is preferably $\lambda/4/n_{r10}$, while that of the n-type InP layer 211 is preferably $\lambda/4/n_{r11}$, where $\lambda$, $n_{r10}$, and $n_{r11}$ are the emitting wavelength of this VCSEL 200, the effective refractive index of the n-type InGaAsP and the n-type InP, respectively.

The upper DBR 7 has the similar structure to those of the first embodiment shown in FIG. 1, FIG. 2, and FIG. 7.

The active layer 205 includes the multi-quantum well layer comprised of the InGaAsP and the other InGaAsP having different composition to the former InGaAsP. The active layer 205 may include a single quantum well (SQW) similar to the first embodiment. Between the active layer 205 and the lower DBR 203 is preferably provided with a first InGaAsP layer 225, while a second InGaAsP layer 227 is preferably provided between the active layer 205 and the upper DBR 7. These first and second InGaAsP layers and the active layer 205 form the optical cavity.

Between the second InGaAsP layer 227 and the upper DBR 7 is further provided with the second upper DBR 204, which is comprised of a plurality of p-type InGaAsP layers 241 and a plurality of p-type InP layers 243 alternately stacked to each other. The uppermost layer of the second upper DBR 204 is the p-type InP layer 243, while the lowermost layer thereof is the p-type InGaAsP layer 241. In the present embodiment shown in FIG. 8, this second upper DBR 204 includes four (4) p-type InGaAsP layers 241 alternately stacked with four (4) p-type InP layers 243.

A thickness of the p-type InGaAsP layer 241 and that of the p-type InP layer 243 are $\lambda/4/n_{r8}$ and $\lambda/4/n_{r9}$, respectively, assuming that the emitting wavelength and refractive indices of the p-type InGaAsP layer 241 and the p-type InP layer 243 are $\lambda$, $n_{r8}$ and $n_{r9}$, respectively. The uppermost p-type InGaAsP layer 241 of the second upper DBR 204 includes a center region 212 and a peripheral region 214 surrounding the center region 212. On the center region 212 is provided with the p-type InP layer 243, which is the uppermost layer of the second upper DBR 204, and the upper DBR 7, while a p-type electrode 15 is formed on the peripheral region 214. Accordingly, the p-type electrode 15 is directly in contact with the p-type InGaAsP layer 241 of the second upper DBR 204, and wires on the side surface thereof with an insulating layer 16 therebetween. The n-type electrode 17 is formed on the back surface of the n-type InP substrate 201.

The VCSEL 200 includes the second upper DBR 204 and the functional upper DBR 7 is attached thereto. Accordingly, even the active layer 205 and the upper DBR 7 have different material systems each other, in particular, even semiconductor materials including in respective DBRs have far mismatched lattice constant, the VCSEL 200 having the DBR with an enough reflectivity may be obtained in ease. For the present case that the active layer has semiconductor materials having a lattice constant similar to that of InP, it is quite hard to obtain the upper DBR having a functional reflectivity with InP based materials. However, by attaching the upper DBR 7, which contains materials with GaAs based semiconductors and is independently formed, to the second upper DBR 204, the VCSEL 200 shown in FIG. 8 may be obtained in ease. Although the present embodiment uses the active layer 205 made of InP based material, another configuration including GaAs based materials may be applicable to the active layer 205.

Next, the method for manufacturing the VCSEL 200 will be described. First, to form the upper DBR 7, a plurality of AlAs layers 59 and a plurality of GaAs layers are alternately grown by the epitaxial growth technique. The embodiment shown in FIG. 8 includes six (6) AlAs layers and six (6) GaAs layers are grown. Thus grown AlAs layers are converted to aluminum oxide layers by the oxidization, which preferably include $Al_xO_y$. The upper DBR 7 may be thus formed on the GaAs substrate.

On the other hand, a plurality of n-type InGaAs layers 219 doped with Si and a plurality of n-type InP layers 221 also doped with Si are alternately grown on the n-type InP substrate 201. This growth is carried out independently of the process for the upper DBR 7. The present embodiment includes twenty-six (26) n-type InGaAsP layers 219 and twenty-five (25) n-type InP layers 221 are grown on the n-type InP substrate 201. The composition of the n-type InGaAsP layer 219 corresponds to the band gap wavelength $\lambda g$ thereof being 1.4 $\lambda$m. Thus, the lower DBR 203 may be formed on the n-type InP substrate.

Subsequently, the first InGaAsP layer 225, the active layer 205 and the second InGaAsP layer 227 are successively grown on the lower DBR 203 by the epitaxial growth technique. The compositions of the first and second InGaAsP layers correspond to the band gap wavelength $\lambda g$ to be 1.2 µm.

Next, a plurality of p-type InGaAsP layers 241 and a plurality of p-type InP layers 243 are alternately grown on the second InGaAsP layer 227. In the embodiment shown in FIG. 8, four (4) p-type InGaAsP layers 241 and four (4) p-type InP layers are grown. The composition of the p-type InGaAsP layer 241 corresponds to the band gap wavelength $\lambda g$ to be 1.4 µm. Thus, the second upper DBR 204 are formed on the second InGaAsP layer 227.

Subsequent to the growth of semiconductor layers, the upper DBR 7, which is independently formed, is attached to the second upper DBR 204 in a hydrogen atmosphere at 150 degree Celsius. The lowermost layer of the upper DBR 7 is the GaAs 31, while the uppermost layer of the second upper DBR 204 is the p-type InP 243. Thus, the GaAs 31 and the p-type InP 241 are attached to each other by the interface s shown in FIG. 8.

The VCSEL 200, in which the upper DBR 7 is attached thereto, is thermally treated at around 600 degree Celsius in hydrogen atmosphere to release stress induced in the interface s by the attachment. Thinning the GaAs substrate of the upper DBR 7 by etching so as to leave the GaAs layer with a substantial thickness to cover the aluminum oxide layer thereunder. The VCSEL 200 of the second embodiment is completed after depositing the insulating film 16 and forming the p-type and the n-type electrodes, 15 and 17, respectively.

Third Embodiment

Figure 9:
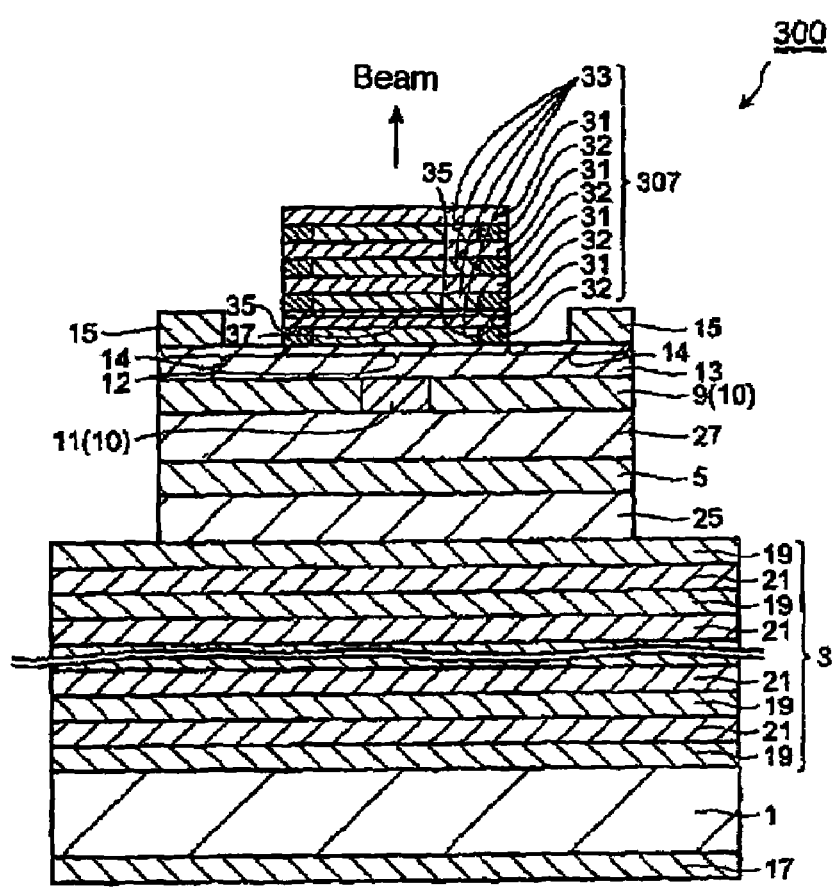
FIG. 9 is a schematic cross section showing the third embodiment of the VCSEL according to the present invention.

Next, another VCSEL 300 according to the third embodiment of the invention will be described. FIG. 9 is a schematic cross section showing the third VCSEL 300 of the invention. The VCSEL 300 includes the lower DBR 3 and the upper DBR 7, both provided on the n-type GaAs substrate. Between the lower and upper DBRs is provided with the active layer 5.

The VCSEL 300 provides an upper DBR 307 whose structure is different to that of the upper DBR 7 of the first embodiment shown in FIG. 2. That is, the upper DBR 307 of this embodiment provides a plurality of GaAs layers 31, each GaAs layer 31 including a center region 37 and a peripheral region 35 surrounding the center region 37. On the center region 37 of respective GaAs layers 31 is provided with the aluminum oxide layer 33, while another semiconductor layer 32 is provided on the peripheral region 35. The another semiconductor layer 32 includes at least one of AlGaAs or AlAs. Adhesion between the GaAs layer 31 and the semiconductor layer 32 is better than that between the GaAs layer 31 and the aluminum oxide layer 33. Therefore, the other semiconductor layer 32 may prevent the aluminum oxide layer 33 from peeling off from the GaAs layer 31, thereby enhancing the reliability of the VCSEL 300 comparing to the structure of the upper DBR 7 without the other semiconductor layer 32.

The aluminum oxide layer 33 is provided on the center region 37 through which the laser beam passing, accordingly, the function of the upper DBR 307, i.e. enough reflectivity to form the optical cavity, does not vitiate in a wide wavelength range. Moreover, a reduced number of pain in the upper DBR, i.e. the aluminum oxide layer and the GaAs layer, does not change in the present embodiment, which shrinks the size of the VICSEL 300.

Figure 10A:
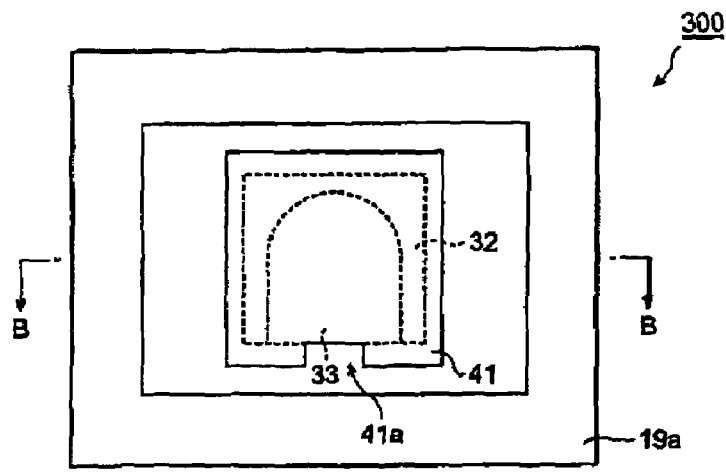
FIG. 10A is a plan view schematically showing a process for manufacturing the VCSEL.
Figure 10B:
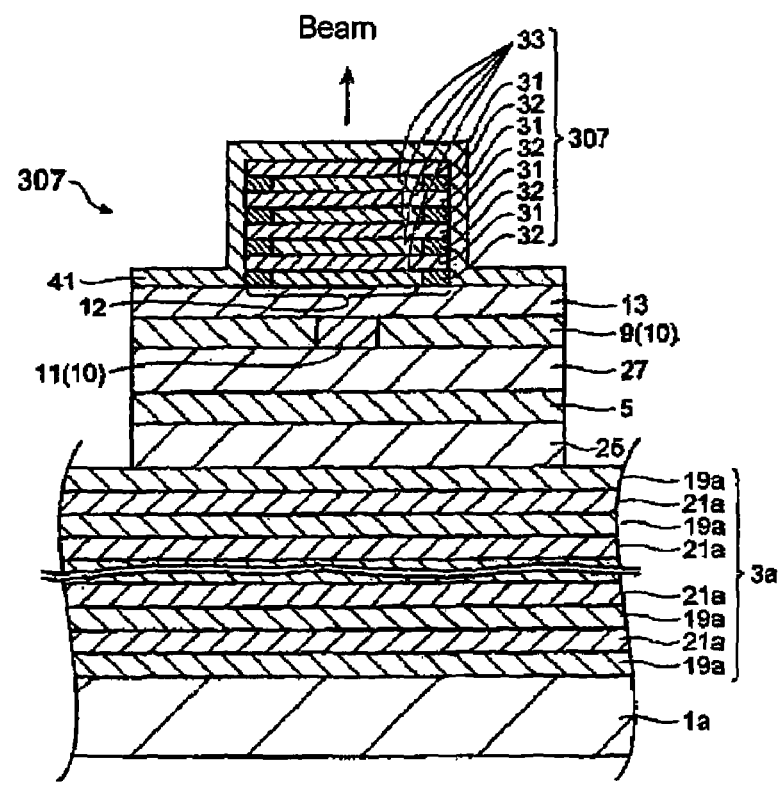
FIG. 10B is a cross section taken along the line B-B in FIG. 10A.

Next, the process for manufacturing the VCSEL 300 will be described as referring to FIG. 6, FIG. 9, and FIG. 10. FIG. 10A is a plan view showing a process of the VCSEL 300, and FIG. 10B is a cross section taken along the line B-B shown in FIG. 10A. The VCSEL 300 is, similar to prior embodiment shown in FIG. 2, formed by the sequential growth of the lower DBR, the active layer and the upper DBR, and by the etching several times subsequently to those growth. After the etching, the following characteristic process is carried out.

(Oxidization)

An insulating film 41 is deposited on the side surface of the upper DBR stacks 7b shown in FIG. 6. This insulating film 41, which is made of silicon nitride (SiN) for example, has an opening 41a on the side surface thereof as shown in FIG. 10A. Oxidizing the p-type AlGaAs film 11b in selective converts the film 11b to the current confinement layer 10. The size of the center portion 11 is preferably 5 µm square.

The aluminum oxide layer 33 shown in FIG. 10A and FIG. 10B may be obtained by the selective oxidization of the AlAs layer 33b shown in FIG. 6. The oxidization advances from the opening 41a provided in the side of the insulating film 41, and lefts the other semiconductor layer 32 as regions not oxidized in the AlAs films 33b. Thus, the upper DBR 307 may be obtained on the center portion 12 of the p-type GaAs layer 13, which includes the other semiconductor layer 32 and the aluminum oxide layer 33 adjacent to each other.

Oxidization may be carried out by thermal oxidization in the hydro-thermal atmosphere. The current confinement layer 10 and the aluminum oxide layer 33 may be formed via the same oxidization process, which makes the process for the VCSEL 300 simple, thus reduces the cost thereof.

Since the aluminum (Al) content in the AlAs film 33b is greater than that of the p-type AlGaAs film 11b, the AlAs layer is oxidized faster than the p-type AlGaAs film 11b. Therefore, by controlling the aluminum (Al) content of the p-type AlGaAs film 11b, the selective oxidization for the AlAs layer 33b and the p-type AlGaAs layer may be carried out in the same time. The shape and the size of the aluminum oxide layer 33 may be adjusted by controlling the shape of the AlAs layer and that of the p-type AlGaAs layer, or by controlling the size and the shape of the opening 41a provided in the insulating film. Finally, the p-type and n-type electrodes are formed to complete the VCSEL 300.

Many modifications and other embodiments of the present invention, within the scope of the claims, will become apparent to a skilled artisan. For example, although the embodiments disclosed herein have the functional DBR in the upper portion of the VCSEL, the functional DBR may be formed as the lower DBR. Although the functional DBR is the stacked aluminum oxide layer and the GaAs layer, the other group III-V compound semiconductor material may be applicable in stead of the GaAs layer.

The polarity of the VCSEL has the n-type substrate and the n-type electrode is formed on the back surface of the substrate. However, an opposite polarity may be applicable. That is, the semiconductor layers may be grown on the p-type substrate, and the n-type electrode is formed on the layer provided on the upper side of the active layer and the p-type electrode is attached to the back surface of the substrate.

Moreover, the present invention does not always require the n-type GaAs substrate. That is, the lower DBR, the active layer and the upper DBR are formed on a support member after these layers are grown on the n-type GaAs substrate, detached therefrom and positioned on the support member.

The current confinement layer 10 may be formed by the selective oxidization of the p-type AlAs.

The active layer may have a quantum dot structure formed by a combination of InGaAs and GaAs, or by another combination of GaInNAs and GaAs. These quantum dot structure show the emitting wavelength from 1.3 µm to 1.55 µm, which corresponds to the wavelength applicable to the optical communications.

Although the aluminum oxide layer in the present invention is derived from the AlAs layer, the AlGaAs layer may be oxidized to the aluminum oxide layer.

In the second embodiment, the upper DBR 7 is attached on the second upper DBR 204. However, the second upper DBR 204 may be omitted, namely, the upper DBR 7 may be attached to the second GaInAsP layer 227.

These modifications will not affect the scope of the claims. Therefore, it is to be understood that the invention is not limited to the specific embodiments disclosed herein and that modifications and other embodiments may be made within the scope of the claims. Although specific terms are employed herein, they are used in a generic and descriptive sense only and not for purposes of limitation.

I claim:

1. A vertical cavity surface emitting laser diode, comprising:
    a semiconductor substrate;
    a first distributed Bragg reflector arranged on said substrate;
    a second distributed Bragg reflector including a plurality of layer pairs with each pair comprised of a first semiconductor layer and an aluminum oxide layer;
    a third distributed Bragg reflector arranged between said second distributed Bragg reflector and said active layer, said third distributed Bragg reflector including a plurality of layer pairs with each comprised of a third semiconductor layer and a fourth semiconductor layer; and
    an active layer sandwiched by said first distributed Bragg reflector and said second distributed Bragg reflector,
    wherein said pairs of said first semiconductor layer and said aluminum oxide layer are stacked, and
    wherein said first semiconductor layers and said aluminum oxide layers in said second distributed Bragg reflector each have a thickness of a quarter wavelength of an emitting wavelength of said laser diode, and
    wherein a lattice constant of said third and fourth semiconductor layers is substantially matched to a lattice constant of said substrate and substantially mismatched to said first semiconductor layer.

2. The vertical cavity surface emitting laser diode according to claim 1,
wherein a number of pairs comprised of said first semiconductor layer and said aluminum oxide layer is greater than or equal to five.

3. The vertical cavity surface emitting laser diode according to claim 1,
wherein said second distributed Bragg reflector further includes a plurality of second semiconductor layers, and said first semiconductor layer includes a center region and a peripheral region surrounding said center region, said aluminum oxide layer being provided on said center region and said second semiconductor layer being provided on said peripheral region.

4. The vertical cavity surface emitting laser diode according to claim 1,
further comprising a current confinement layer between said active layer and said second distributed Bragg reflector.

5. The vertical cavity surface emitting laser diode according to claim 1,
wherein said first semiconductor layers are GaAs.

6. A vertical cavity surface emitting laser diode, comprising:
a semiconductor substrate;
a first distributed Bragg reflector arranged on said substrate;
a second distributed Bragg reflector including a plurality of pairs comprised of a first semiconductor layer and an aluminum oxide layer;
an active layer sandwiched by said first distributed Bragg reflector and said second distributed Bragg reflector; and
a third distributed Bragg reflector between said second distributed Bragg reflector and said active layer, said third distributed Bragg reflector including a plurality of pairs comprised of a third semiconductor layer and a fourth semiconductor layer;
wherein said semiconductor layers and said aluminum oxide layers are alternately stacked, and
wherein a lattice constant of semiconductor materials comprising said third and fourth semiconductor layers is substantially matched to a lattice constant of a semiconductor material comprising said substrate and substantially mismatched to a lattice constant of said first semiconductor layer.

7. A method for manufacturing a vertical cavity surface emitting laser diode having a first distributed Bragg reflector, a second Bragg reflector and an active layer sandwiched between said first and second Bragg reflectors, said second Bragg reflector including a plurality of layer pairs with each pair comprised of a first semiconductor layer and an aluminum oxide layer, said method comprising the steps of:
(a) successively growing, on a semiconductor substrate, a plurality of layer pairs with each pair comprised of first and second semiconductor films for said first distributed Bragg reflector, a semiconductor film for said active layer, and a plurality of layer pairs with each pair comprised of third and fourth semiconductor films for said second distributed Bragg reflector, said fourth film containing aluminum (Al);

(b) forming a mesa for said second distributed Bragg reflector;
(c) oxidizing said fourth semiconductor film containing aluminum to convert said fourth semiconductor film into said aluminum oxide layer,
wherein a thickness of said third semiconductor film corresponds to a quarter-wavelength of said third semiconductor film for an emitting wavelength of said laser diode and a thickness of said aluminum oxide layer after oxidizing said fourth semiconductor film corresponds to a quarter of said emitting wavelength of said laser diode.

8. The method according to claim 7,
wherein said step of growing semiconductor layers further includes a growth of a semiconductor layer for a current confinement layer after said growth of said semiconductor layers for said active layer and before said growth of semiconductor layers for said second distributed Bragg reflector, said semiconductor layer for said current confinement layer containing aluminum, and
said process further comprising a step of oxidizing said semiconductor layer for said current confinement layer containing aluminum.

9. The method according to claim 7, further including, after step (b), a step of forming an insulating film to cover said mesa for said second distributed Bragg reflector, said insulating film having an opening on a side surface of said mesa to selectively oxidize said aluminum contained in said fourth semiconductor film.

10. The method according to claim 7,
wherein said third semiconductor film is GaAs and said forth semiconductor film is one of AlGaAs and AlAs.

11. A method for manufacturing a vertical cavity surface emitting laser diode having a first distributed Bragg reflector, a second distributed Bragg reflector, a third distributed Bragg reflector and an active layer, said third Bragg reflector being arranged between said second distributed Bragg reflector and said active layer and including a plurality of layer pairs with each pair comprised of a semiconductor layer and an aluminum oxide layer, said active layer being arranged between said first distributed Bragg reflector and said third distributed Bragg reflector, said method comprising the steps of:
(a) growing a plurality of layer pairs with each pair comprised of first and second semiconductor films for said first distributed Bragg reflector, a semiconductor film for said active layer, and a plurality of layer pairs with each pair comprised of third and fourth semiconductor films for said second distributed Bragg reflector;
(b) growing, independently of step (a), a plurality of layer pairs with each pair comprised of fifth and sixth semiconductor films for said third distributed Bragg reflector, said fifth semiconductor film containing aluminum (Al);
(c) oxidizing said fifth semiconductor film containing aluminum to convert said fifth semiconductor film into said aluminum oxide layer; and
(d) attaching said third distributed Bragg reflector to said second distributed Bragg reflector in a hydrogen atmosphere,
wherein a thickness of said sixth semiconductor film corresponds to a quarter of said sixth semiconductor film for an emitting wavelength of said laser diode and a thickness of said aluminum oxide layer after oxidizing said fifth semiconductor film corresponds to a quarter of said emitting wavelength of said laser diode.

12. The method according to claim 11, further comprises, after said step (d), a step of
   (e) thermally treating said vertical cavity surface emitting laser diode in a hydrogen atmosphere at temperatures around 600 degree Celsius.

13. The method according to claim 11,
   wherein said step (a) is carried out on a first semiconductor substrate with a first lattice constant, and said step (b) is carried out on a second semiconductor substrate with a second lattice constant different to said first lattice constant, and
   wherein said method further comprises a step of, after said step (c), removing said second semiconductor substrate from said third distributed Bragg reflector.

14. The method according to claim 11,
   wherein said sixth semiconductor film is GaAs and said fifth semiconductor film is one of AlGaAs and AlAs.

* * * * *